US010938400B1

(12) United States Patent
Stein et al.

(10) Patent No.: US 10,938,400 B1
(45) Date of Patent: Mar. 2, 2021

(54) BROADBAND DIGITIZER WITH A LOW FREQUENCY BYPASS

(71) Applicant: Guzik Technical Enterprises, Mountain View, CA (US)

(72) Inventors: Anatoli B. Stein, Atherton, CA (US); Valeriy Serebryanskiy, Santa Clara, CA (US); Vladislav Anatolievich Klimov, San Jose, CA (US); Sergey Konshin, Mountain View, CA (US)

(73) Assignee: GUZIK TECHNICAL ENTERPRISES, Mountain View, CA (US)

( * ) Notice: Subject to any disclaimer, the term of this patent is extended or adjusted under 35 U.S.C. 154(b) by 0 days.

(21) Appl. No.: 16/933,404

(22) Filed: Jul. 20, 2020

(51) Int. Cl.
  *H03M 1/12* (2006.01)
  *H03M 1/10* (2006.01)
  *H03M 1/06* (2006.01)

(52) U.S. Cl.
  CPC ............... *H03M 1/12* (2013.01); *H03M 1/06* (2013.01); *H03M 1/10* (2013.01)

(58) Field of Classification Search
  CPC ............. H03M 1/12; H03M 1/10; H03M 1/06
  USPC ................. 341/155, 120, 118, 126
  See application file for complete search history.

(56) References Cited

U.S. PATENT DOCUMENTS

| 7,221,220 B2 | 5/2007 | Stein et al. | |
| 7,511,577 B2 | 3/2009 | Bradley | |
| 2018/0026816 A1* | 1/2018 | Pickerd | ............ H04B 15/00 |
| | | | 375/232 |
| 2018/0159548 A1* | 6/2018 | Schmidt | ............ H03M 1/1009 |

* cited by examiner

*Primary Examiner* — Joseph J Lauture
(74) *Attorney, Agent, or Firm* — Burns & Levinson, LLP; Joseph M. Maraia

(57) ABSTRACT

A broadband digitizer for an applied broadband analog input signal SA(t). The digitizer includes a low frequency analog-to-digital converter (LF ADC) channel and a high frequency analog-to-digital converter (HF ADC) channel, an input splitter coupled to respective inputs to the LF ADC channel HF ADC channels, a frequency divider, and a combining unit. Low frequency portions of SA(t) are digitized to digital signal $SD_{LF}[n]$ in the LF ADC channel and high frequency portions of SA(t) are digitized to digital signal $SD_{HF}[n]$ in the HF ADC channel. The combining unit combines the digital signals $SD_{LF}[n]$ and $SD_{HF}[n]$ to form distortion-reduced SD[n], corresponding to SA(t). Front ends of the LF ADC channel and HF ADC channel reduce level-caused distortions, and the combining unit reduces ADC frequency-caused, time-position-caused, and interpolation-caused distortions.

12 Claims, 5 Drawing Sheets

US 10,938,400 B1

BROADBAND DIGITIZER WITH A LOW FREQUENCY BYPASS

FIELD OF THE TECHNOLOGY

The present disclosure relates to method and apparatus for digitizing an analog signal, which occupies a broad frequency band.

BACKGROUND OF THE TECHNOLOGY

A digitizer is a device, which converts an arbitrary analog signal to a digital signal. A common form of digitizer is known as an analog to digital converter (ADC). A front end or input, of an ADC typically might comprise a number of functional units, such as amplifiers, controlled attenuators, anti-aliasing low pass filters with switchable cutoff frequencies, and the like. The design of the respective functional units is challenging for extreme broadband applications.

For high frequency applications, typical amplifiers might be built with GaAs or SiGe RF transistors, raising design issues since such transistors are known to distort the low frequency components of the processed signals by increasing the level of such low frequency components relative to the level of high frequency components of the processed signals.

Fast switches, for example, those based upon PIN diodes, generally cannot operate at frequencies below 1 MHz at all, because of limited carrier lifetimes in the switches. Silicon-based switches and amplifiers cannot typically operate below 10-100 kHz, and do not tolerate DC voltage at their respective inputs.

On the other hand, many applications of digitizers require the ability to work with broadband signals, often including low frequency as well as DC components. Such a situation takes place, for example, in extreme broadband digitizers, which are intended for operation in a range from DC up to high RF frequencies. Therefore, there is a need for development of digitizers which are able to process extreme broadband signals with limited distortion in the low frequency area.

In U.S. Pat. No. 7,511,577, a block diagram of a prior art broadband amplification unit 10 is proposed, which is shown in FIG. 1 herein. As shown, a broadband input signal 11 is split by a capacitor 12 and an inductance 16 into two parts. A first part, comprising the high frequency components of the input signal, passes though the capacitor 12 to an amplifier 13, and then through a capacitor 14 to a capacitor terminal 14A. A second part, comprising the low frequency components of the input signal (including a DC component, if any), passes though the inductance 16 to an input of a low frequency (LF) bypass unit 18 and then through an inductance 17, to an inductance terminal 17A.

By way of a junction of terminals 14A and 17A, an output of the amplifier 13 and an output of the low frequency bypass unit 18, are combined to produce a device output signal at a device output 15.

The separation of the routes of the high frequency components and the low frequency components in FIG. 1 makes it possible to partially correct the frequency response of each route independently. An optimal selection of the capacitors and inductances, as well as the features of the low frequency bypass unit 18, enables, to a limited extent, a desired frequency response of the prior art broadband amplification unit 10 as a whole. A disadvantage of the prior art amplification unit 10 lies in the fact that the capacitors and inductances, which are used to split the input signal and to reconstruct it, are characterized by frequency dependencies, which cause distortions of the amplitudes and phases of the signal components, hampering the overall device frequency response of the prior art amplification unit 10.

In U.S. Pat. No. 7,221,220, another prior art approach to building a broadband RF amplification unit is disclosed. A block diagram, illustrating that approach, is shown in FIG. 2 herein. In that block diagram, for device 20, an input signal is applied by way of an input 211 to a first terminal 212A of a capacitor 212. A second terminal 212B of capacitor 212 is coupled by way of an auxiliary capacitor 213 to an input 214A of an RF amplifier 214. The two terminals 212A and 212B of the capacitor 212 are connected through resistors 215 and 216, respectively, to respective ones of inputs 219A and 219B of a differential amplifier 219. Differential amplifier 219 forms an input stage of a low frequency (LF) bypass unit 220. An output signal of differential amplifier 219 at terminal 219C, is applied to an input 220A of LF bypass unit 220. An output signal of LF bypass unit 220 at terminal 220B, is combined with an output signal of RF amplifier 214 at terminal 214B in an adder 217, to produce an output of device 20 at output 218.

Capacitor 212 of device 20 in FIG. 2, separates low frequency components (including any DC component) and the high frequency components of any broadband input signal at input 211. The high frequency components of the input signal are passed by way of capacitors 212 and 213 to terminal 214A of RF amplifier 214, and while impeding the passage thereto of the low frequency components.

Importantly, with that configuration, a sum of voltage between the terminals of the capacitor 212 and the input voltage of the RF amplifier 214 exactly reproduces the input signal 211. Therefore, separation of the low frequency component and the high frequency component does not create any additional distortions of the processed signal.

The purpose of the current disclosure is to use an approach similar to that which has been outlined in U.S. Pat. No. 7,221,220, in a novel configuration to provide an improved broadband digitizer with minimal frequency distortions.

DETAILED DESCRIPTION

As it was noted above, the technologies and device components which are typically used to build a prior art broadband digitizer, are different for signals of the various frequencies over the broad band of intended operation. For this reason, it is difficult to create a digitizer operative with a market-demanded high precision in a broad frequency range. In the present disclosure, an input analog signal-to-be-processed SA(t) is split into two signals: a first analog signal $SA_{LF}(t)$, characterized by a relatively low frequency spectral portion of SA(t), and a second analog signal $SA_{HF}(t)$, characterized by a relatively high frequency spectral portion of SA(t). Each of these two analog signals, $SA_{LF}(t)$ and $SA_{HF}(t)$, is processed separately and is separately converted from analog to digital form, producing a first digital signal $SD_{LF}[n]$ (the "low frequency digital signal") and a second digital signal $SD_{HF}[n]$ (the "high frequency digital signal"). The preparation for analog to digital conversion, and the conversion itself, would normally, in accord with the prior art, cause distortions of the resultant processed signals (mostly in the form of frequency dependent amplitude and phase distortions) with different gains and delays for both the low frequency digital signal and the high frequency digital signal. Correction/reduction of the distortions, together with alignment of the gains and delays of the digital signals $SD_{LF}[n]$ and $SD_{HF}[n]$, collectively, the "distortions", are provided by the systems and methods of this disclosure. After equalization and correction, the resultant the low frequency digital signal and the high frequency digital signal are added up to form an output distortion-reduced digital signal SD[n] corresponding to SA(t).

Figure 1:
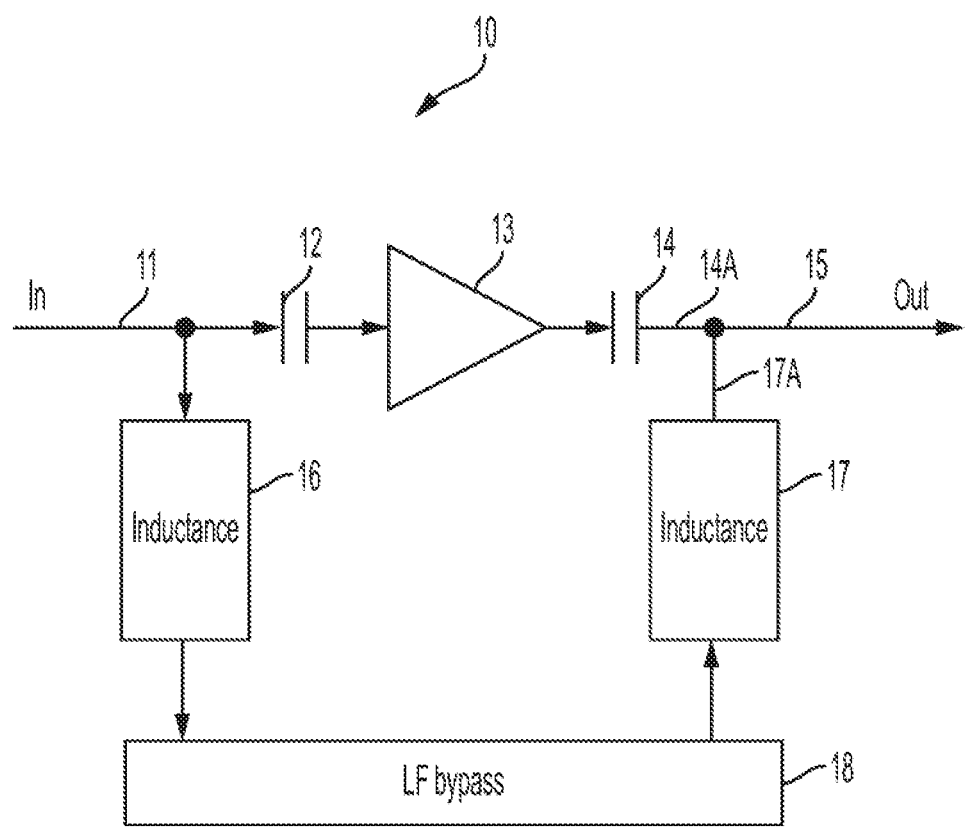
FIG. 1 shows a block diagram of a broadband RF amplifier component disclosed in prior art U.S. Pat. No. 7,511,577.
Figure 2:
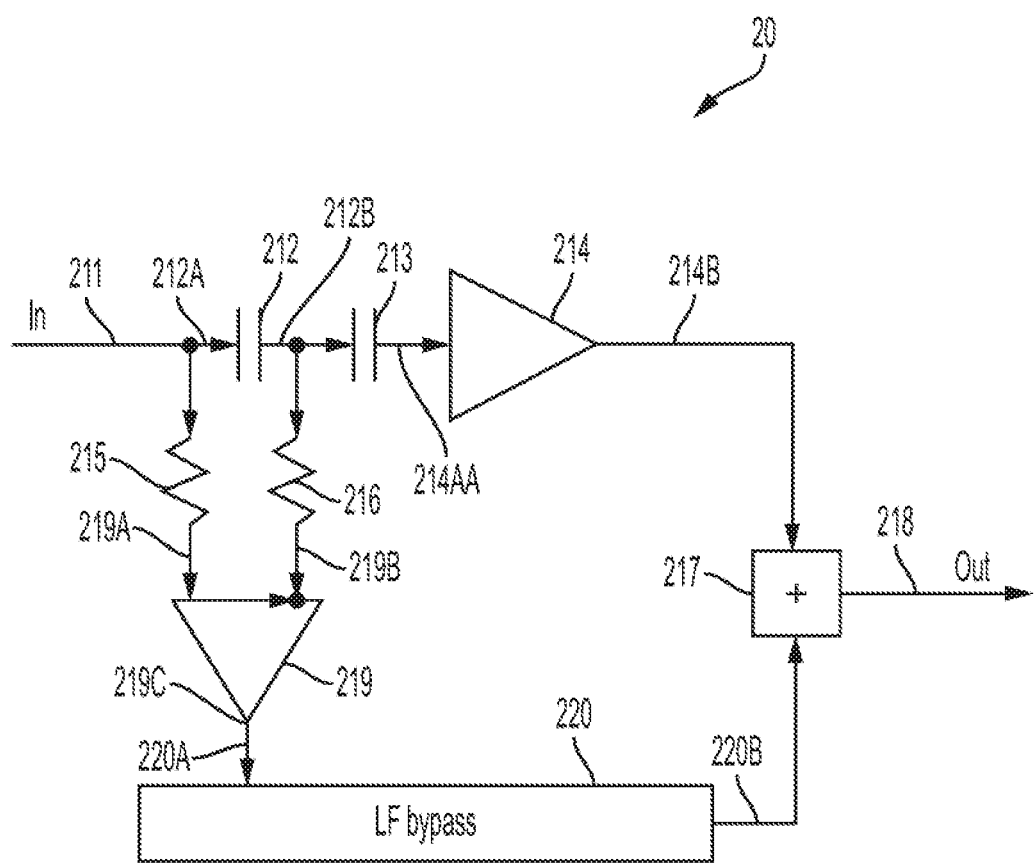
FIG. 2 shows a block diagram of a broadband RF amplifier component disclosed in prior art U.S. Pat. No. 7,221,220.
Figure 3:
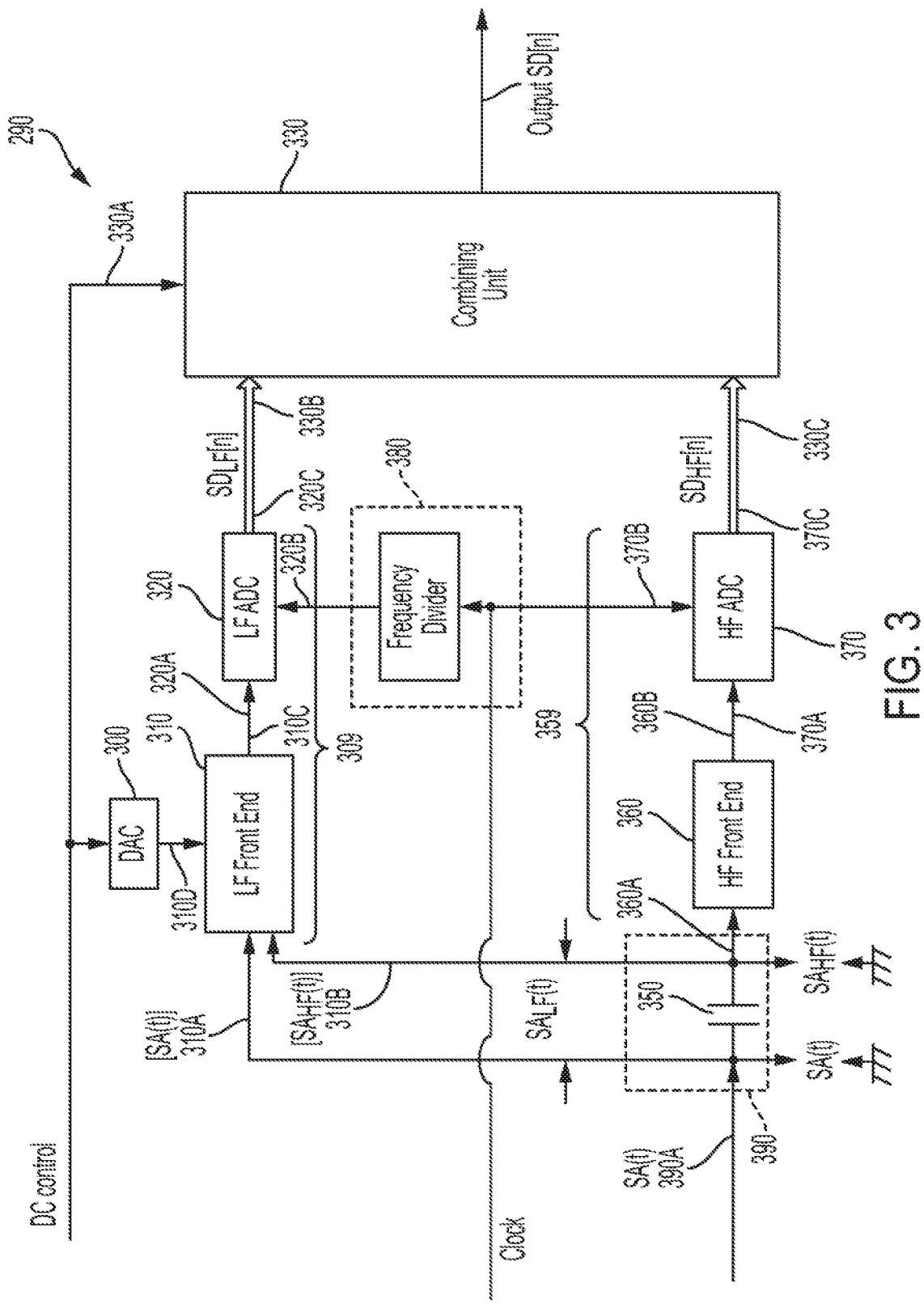
FIG. 3 shows a block diagram of an exemplary broadband digitizer in accord with the current disclosure.

A block diagram of an exemplary broadband digitizer 290 of the disclosure is shown in FIG. 3. As illustrated, broadband digitizer 290 principally includes a low frequency analog-to-digital converter (LF ADC) channel 309 and a high frequency analog-to-digital converter (HF ADC) channel 359, an input splitter 390 coupled to inputs of LF ADC channel 309 and HF ADC channel 359, respectively, a frequency divider 380, and a combining unit 330.

Splitter 390 is adapted to receive a broadband analog input signal SA(t) on an input line 390A, split that broadband analog input signal into a low frequency analog input signal $SA_{LF}(t)$ characterized by a relatively low frequency spectrum, and a high frequency analog input signal $SA_{HF}(t)$ characterized by a relatively high frequency spectrum.

LF ADC channel 309 includes a low frequency (LF) front end 310 coupled in series to an input 320A of a low frequency analog to digital converter LF ADC 320. LF front end 310 includes differential inputs 310A and 310B adapted to receive $SA_{LF}(t)$ across those inputs, process that signal and apply it to an input 320A of LF ADC 320.

HF ADC channel 359 includes a high frequency (HF) front end 360 coupled in series to an input 370A of a high frequency analog to digital converter (HF ADC) 320. HF front end 360 includes an input 360A adapted to receive $SA_{HF}(t)$ referenced to ground potential, process that signal and apply it to an input 370A of HF ADC 370.

Frequency divider 380 is adapted to receive a system clock and provide a divided-down low frequency (LF) ADC sampling clock to a LF clock input 320B of LF ADC 320. In response to the LF ADC sampling clock, LF ADC 320 is operative to digitize the analog signal at input 320A and apply that digitized signal $SD_{LF}[n]$ via output 320C to an input 330B of combining unit 330.

Similarly, Frequency divider 380 is further adapted to provide a high frequency (HF) ADC sampling clock to a HF clock input 370B of HF ADC 370. in response to the HF ADC sampling clock, HF ADC 370 is operative to digitize the analog signal at input 370A and apply that digitized signal $SD_{HF}[n]$ via output 370C to an input 330C of combining unit 330.

In response to $SD_{LF}[n]$ and $SD_{HF}[n]$, combining unit 330 processes those applied digital signals and provides a distortion-reduced digital signal SD[n] at a system output.

With this configuration, in operation, a broadband analog signal SA(t) applied to the signal input 390A of the digitizer 290 follows to the left (as shown in FIG. 3) terminal of the capacitor 350. The low frequency components of the signal SA(t) are isolated at the capacitor 350, forming the signal $SA_{LF}(t)$, which is applied across to the differential inputs 310A and 310B of the LF front end 310. The high frequency components of the input signal pass through the capacitor 350 without difficulty and are applied to the input of the HF front end 360. According to the Second Kirchhoff's low, the voltage between the left (as shown in FIG. 3) terminal of the capacitor 350 and ground potential (the signal SA(t)) equals the sum of the voltage over the capacitor 350 (the signal $SA_{LF}(t)$) and the voltage between the right (as shown in FIG. 3) terminal of the capacitor 350 and ground potential (the signal $SA_{HF}(t)$):

$$SA(t)=SA_{LF}(t)+SA_{HF}(t). \qquad (1)$$

Thus, if the input signals of differential inputs 310A and 310B of LF front end 310 and the input of HF front end 360 are added up, the resulting sum equals the signal at the device 290 input exactly.

The processing of signals in the LF front end 310 and HF front end 360 inevitably distorts them to some extent, as well as disrupts the relationship between their levels and their relative position in time. For these reasons, the adding up the output signals of the LF front end 310 and HF front end 360 in general does not result in an accurate reproduction of the initial signal SA(t).

In the configuration illustrated in FIG. 3, the output signal of the LF front end 310 is converted into digital form by the LF ADC 320, while the output signal of the HF front end 360 is converted into digital form by the HF ADC 370 respectively. In other words, the LF front end 310, connected in cascade with the LF ADC 320, form a low frequency analog to digital conversion channel 309, while the HF front end 360, connected in cascade with the HF ADC 370, form a high frequency analog to digital conversion channel 359.

The sequences of digital samples $SD_{LF}[n]$ and $SD_{HF}[n]$, produced by the conversion channels, are applied to associated inputs of combining unit 330. In combining unit 330, frequency distortions of both signals are corrected and the relationship between their levels and their relative position in time are restored. The summing up the corrected digital replicas of the analog signals $SA_{LF}(t)$ and $SA_{HF}(t)$ produces a distortion-reduced, accurate digital reproduction SD[n] of the initial input analog signal SA(t).

A DC control input of the analog to digital conversion system 290 of FIG. 3, carries information about any direct current (DC) component of an input analog signal SA(t). This information is applied in a digital form and is converted into analog signal by a digital to analog converter (DAC) 300. The output of the DAC 300 is connected to an associated input 310D of LF front end 310 to be subtracted from the signal $SA_{LF}(t)$. In the combining unit 330, the DC control signal is added to the output signal SD[n]. This makes it possible for LF front end 310 and LF ADC 320 to operate without DC offset.

Figure 4:
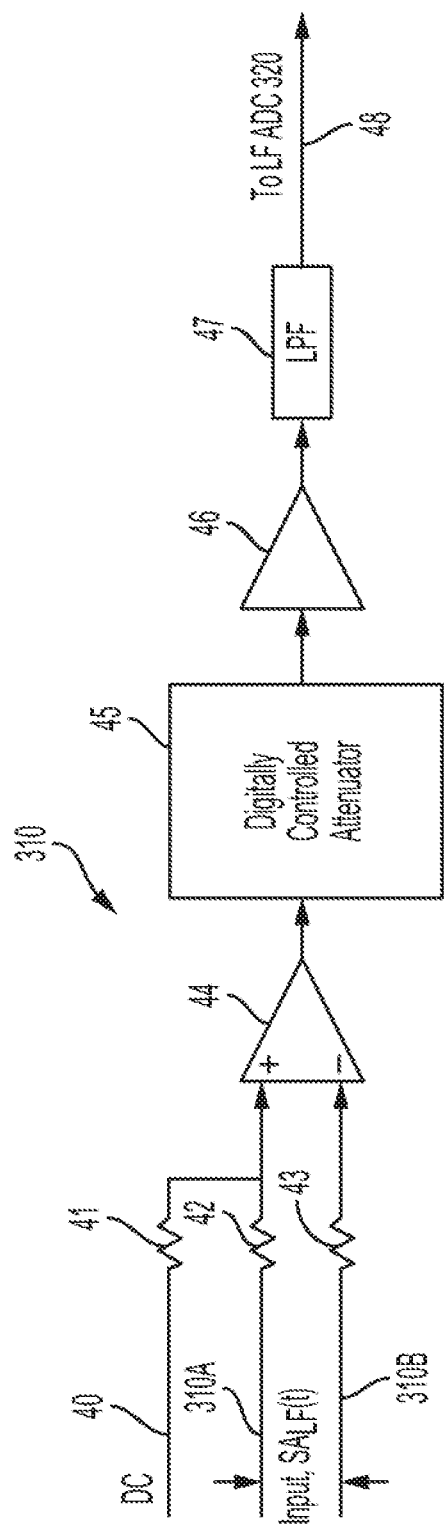
FIG. 4 shows a block diagram of an exemplary front end for the low frequency ADC, incorporated in an exemplary broadband digitizer according to the current disclosure.

An exemplary embodiment of the LF front end 310 is shown in FIG. 4. In that figure, the signal $SA_{LF}(t)$ is connected across terminals 310A and 310B of a differential amplifier 44 through the resistors 42 and 43. The output of the differential amplifier 44 is connected to an input of a digitally controlled attenuator 45. An output signal of digitally controlled attenuator 45 is amplified by an ADC driver 46 and transmitted through a low pass filter 47 to an output 48 of LF front end 310.

DC input 40 of LF front end 310 is connected to a non-inverting terminal of a differential amplifier 44 through a resistor 41. That configuration enables subtraction of a direct current component of the initial analog signal SA(t) from the voltage $SA_{LF}(t)$ coming to the signal input across terminals 310A and 310B of the LF front end 310.

Figure 5:
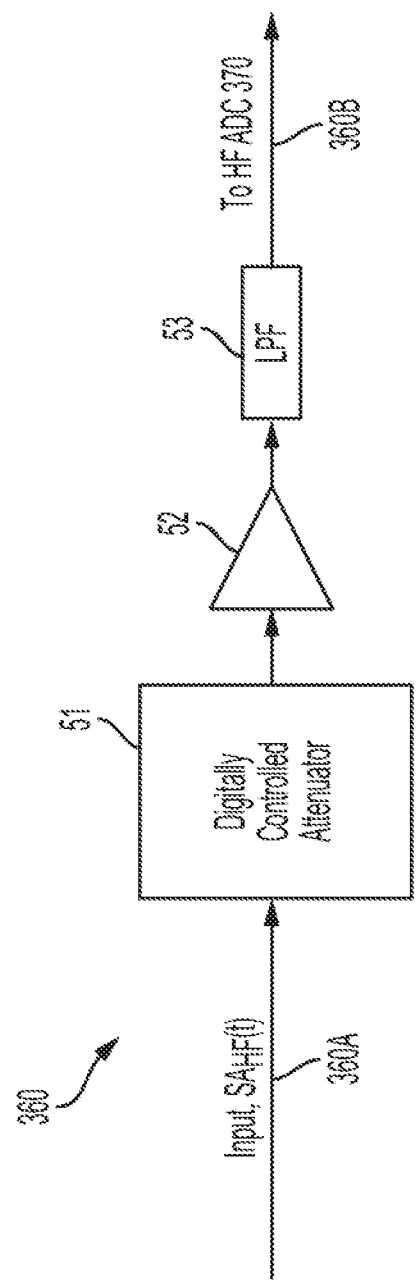
FIG. 5 shows a block diagram of a front end for the high frequency ADC, incorporated in an exemplary broadband digitizer according to the current disclosure.

An exemplary embodiment of HF front end 360 is shown in FIG. 5. In that figure, the input signal $SA_{HF}(t)$ passes to an input 360A of a digitally controlled attenuator 51. An output signal of digitally controlled attenuator 51 is amplified by an ADC driver 52 and is transmitted through a low pass filter 53 to an output 360B of HF front end 360.

Figure 6:
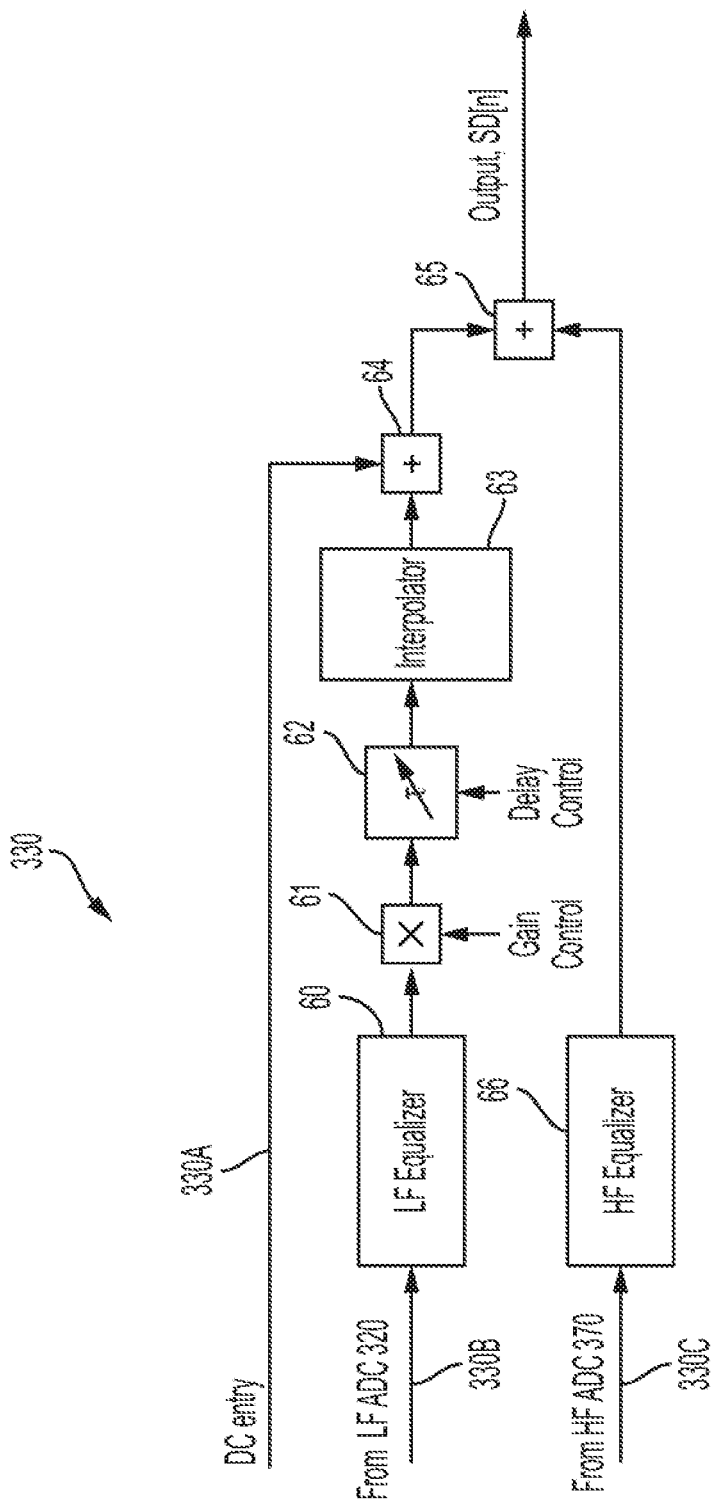
FIG. 6 shows a block diagram of a combining unit, incorporated in an exemplary broadband digitizer according to the current disclosure.

A block diagram of an exemplary form of the combining unit 330 is shown in FIG. 6. Combining unit 330 corrects frequency distortions present in signals $SD_{LF}[n]$ and $SD_{HF}[n]$ produced by LF ADC 320 and HF ADC 370, removing discrepancies between those signals which occurred because of different gains and delays in the low frequency analog to digital converter channel 309 and high frequency analog to digital converter channel 359, as well as adds up the corrected and aligned signals thereby producing the output signal SD[n] of the digitizer 290.

As shown in FIG. 6, the combining unit 330 has two inputs: In LF input 330B which receives digital signal $SD_{LF}(n)$ from the output 320C of LF ADC 320 and In HF input 330C which receives the digital signal $SD_{HF}(n)$ from the output 370C of HF ADC 370. The signal coming to the input In LF input 330B, is processed in a LF equalizer 60 where frequency distortions introduced in LF front end 310 and LF ADC 320, are corrected. The signal coming through the input In HF input 330C is processed in a HF equalizer 66, where frequency distortions introduced in the HF front end 360 and HF ADC 370, are corrected.

An output of LF equalizer 60 passes to a first input of a multiplier 61. A second input of multiplier 61 receives a gain control signal, which is set up by an associated program. Multiplier 61 multiplies the signal which combining unit 330 receives from LF ADC 320 by a gain control voltage so that the level of a resulting signal corresponds to the level of the signal received from HF ADC 370. In this way, any discrepancies which may have occurred because of different gains in the low frequency analog to digital converter channel 309 and high frequency analog to digital converter channel 359, are reduced or eliminated.

Differences in delays of signals processed in the low frequency converter channel 309 and high frequency converter channel 359, are compensated by a controlled delay line 62. The delay of the controlled delay line 62 is set up by a delay control signal in such a way that the signals at the output of HF equalizer 66 and the output of delay line 62 become aligned in time.

Samples in digital signal $SD_{LF}(n)$ (and corresponding samples at the output of controlled delay line 62) follow with a frequency which equals the sampling frequency of LF ADC 320 and is different from the sampling rate of the signal $SD_{HF}(n)$. The output of controlled delay line 62 is connected to an input of an interpolator 63. The interpolator 63 performs a conversion of the signal sampling rate, making it equal to the sampling rate of the signal $SD_{HF}(n)$.

The output of the interpolator 63 is applied to a first input of an adder 64. A second input of adder 64 receives from a "DC entry" input of the combining unit 330, a value of the DC component in the initial analog signal SA(t) (this value has been subtracted from the processed signal in the LF front end 310). By the operation of the adder 64, a correct DC component of the signal $SD_{LF}[n]$ is restored.

Digitally controlled attenuators 45 and 51 of the LF front end 310 and HF front end 360, respectively, operated by an associated program, provide correct levels of signals at the inputs of LF ADC 320 and HF ADC 370. As a result, possible distortions caused by ADCs overload (in case of a too large input level) or by incomplete use of the ADC's resolution (in case of a too small input level), are eliminated. However, the use of different technology during manufacturing can cause different features of the low frequency and the high frequency digitally controlled attenuators 41 and 51 (for example, different values of attenuation which may be set up, different input and output resistance, different delays and so on). This fact may result in additional discrepancies between features of the low frequency analog to digital conversion channel 309 and high frequency analog to digital conversion channel 359.

During a production stage, the gains and the delays of both analog to digital conversion channels 309 and 358 (from the input of the LF front end 310 up to a first input of the adder 65 for the low frequency channel and from the input of the HF front end 360 up to a second input of the adder 65 for the high frequency channel) are measured for each possible combination of the attenuations of the digitally controlled attenuators 45 and 51. The measurement results are used to determine the necessary values of the gain control to be applied to the multiplier 62, and the delay control to be applied to the delay line 63. The so-determined values are stored in a control values memory. At an operation stage, a controlling program sets up attenuations of the digitally controlled attenuators 45 and 51 in accordance with the input signal level. After that, the corresponding control values are read from a control values memory and are used to adjust proper gain control of the multiplier 62 and delay control of the controlled delay line 63. As a result, the accurate agreement of a digital signal SD[n] produced with the input analog signal SA(t), is achieved automatically.

A DC component of an analog signal at the input of the digitizer 290 may be of a substantial size, as compared with the signal's peak-to-peak magnitude. In such a case, a DC component would likely take away a considerable part of the ADC's dynamic range, making difficult a comprehensive digital reconstruction of the signal's fine details. The current disclosure provides some steps for maintaining high resolution of the ADC even in the case of a large DC component.

For example, a value for the estimation of an initial analog signal DC component (in a digital form) can be applied to the "DC control" input of the analog to digital conversion system (see FIG. 3). That value is transformed to an analog amount by DAC 300 and that analog amount enters the LF front end 310 through the "DC" input 310A. Then, that analog amount is subtracted from the input signal $SA_{LF}(t)$ of the LF front end 310. As a result, the DC component at the input of the LF ADC 320 is made equal to zero. In this way, the LF ADC 320 is relieved from the necessity of converting the DC component into digital form.

The digital signal which carries information about the initial size of the DC component, also arrives at the "DC entry" input of the combining unit 330. That value is added to the low frequency corrected signal formed by interpolator 63.

The operations described above lead to a situation, where LF ADC 320 converts a signal with an eliminated DC component to a digital form wherein the digital output signal of the conversion system contains a DC component of correct magnitude.

The foregoing description of the embodiment of the present technology contains some details for purposes of clarity of understanding, the technology is not limited to the detail provided. There are many alternative ways of implementing the technology. The disclosed embodiment is illustrative and not restrictive.

What is claimed is:

1. A method of digitizing a broadband analog signal SA(t), comprising the steps of:
   A. splitting the analog signal SA(t) into two signals:
      i. a high frequency (HF) analog signal $SA_{HF}(t)$ in a relatively high frequency (HF) spectral range, where t is representative of time, and
      ii. a low frequency (LF) analog signal $SA_{LF}(t)$, in a relatively low frequency (LF) spectral range, where t is representative of time,
      whereby $SA_{HF}(t)+SA_{LF}(t)=SA(t)$,
   B. with processing components operative over the HF spectral range,
      i. adjusting the amplitude level of the HF analog signal $SA_{HF}(t)$,
      ii. digitizing the adjusted HF analog signal $SA_{HF}(t)$ to a high frequency (HF) digital signal $SD_{HF}[n]$ using a high frequency (HF) analog to digital converter characterized by a sampling rate $SR_{HF}$, followed by an associated high frequency (HF) equalizer to generate $SD_{HF}[n]$, wherein the HF equalizer is adapted to reduce frequency dependent distortions caused by the level adjustment of the HF analog signal $SA_{HF}(t)$, and the digitizing of the adjusted HF analog signal $SA_{HF}(t)$,
   C. with processing components operative over the LF spectral range,
      i. adjusting the amplitude level of the LF analog signal $SA_{LF}(t)$,
      ii. digitizing the adjusted LF analog signal $SA_{LF}(t)$ to a low frequency (LF) digital signal $SD_{LF}[n]$ using a low frequency (LF) analog to digital converter characterized by a sampling rate $SR_{LF}$, followed by an associated low frequency (LF) equalizer to generate $SD_{LF}[n]$, wherein the LF equalizer is adapted to reduce frequency dependent distortions caused by the level adjustment of LF analog signal $SA_{LF}(t)$, and the digitizing of the adjusted LF analog signal $SA_{LF}(t)$, and
      whereby the output digital signal SD[n] is characterized by reduced frequency dependent distortions compared to that which would be obtained without the frequency dependent distortion reductions of steps B.ii and C.ii, and
   D. combining the HF digital signal $SD_{HF}[n]$ with the LF digital signal $SD_{LF}[n]$ to obtain an output digital signal SD[n] corresponding to the analog signal SA(t).

2. The method of digitizing according to claim 1, comprising in step D,
   changing the sampling rate $SR_{LF}$ of the distortion-reduced LF digital signal by interpolation,
   whereby the changed sampling rate $SR_{LF}$ is equal to the sampling rate $SR_{HF}$ of the distortion-reduced HF digital signal, and
   whereby the output digital signal SD[n] is characterized by a sum of the distortion-reduced HF digital signal and the interpolated distortion-reduced LF digital signal.

3. The method of digitizing according to claim 2, comprising the further step of: aligning the level adjustments and relative time positions of the distortion-reduced LF digital signal whereby distortions in the output digital signal SD[n] are minimized.

4. The method of digitizing according to claim 3, comprising the further step of:
   subtracting an amount equal to a value V of a DC component from the LF analog signal $SA_{LF}(t)$, and
   adding an amount equal to a value V to the output digital signal SD[n],
   whereby, where the input analog signal includes a large DC component, high resolution of the low frequency analog to digital conversion is maintained.

5. A broadband digitizer comprising:
   A. a splitter adapted to receive an applied input analog signal SA(t) at a splitter input and split the received input analog signal SA(t) into a high frequency (HF) analog signal $SA_{HF}(t)$ in a relatively high frequency (HF) spectral range, and a low frequency (LF) analog signal $SA_{LF}(t)$ in a relatively low frequency (LF) spectral range,
   B. a high frequency (HF) analog to digital converter (ADC) channel, including a high frequency (HF) processor operative over the HF spectral range to:
      a. receive the HF analog signal $SA_{HF}(t)$ from the splitter at an HF ADC channel input and adjust the level of the received HF analog signal $SA_{HF}(t)$, and
      b. in a high frequency analog to digital converter (HF-ADC) characterized by a relatively high frequency sampling rate $SR_{HF}$, digitize the amplitude-adjusted HF analog signal $SA_{HF}(t)$ to a high frequency (HF) digital signal $SD_{HF}[n]$,
   C. a low frequency (LF) analog to digital converter (ADC) channel, including a low frequency (LF) processor operative over the LF spectral range, to:
      a. receive the LF analog signal $SA_{LF}(t)$ from the splitter at an LF ADC channel input and adjust the level of the received LF analog signal $SA_{LF}(t)$, and
      b. in a low frequency analog to digital converter (LF-ADC) characterized by a relatively low frequency sampling rate $SR_{LF}$, digitize the amplitude-adjusted LF analog signal $SA_{LF}(t)$ to a low frequency (LF) digital signal $SD_{LF}[n]$,
   D. a frequency distortion processor including:
      a. an HF frequency distortion-reducing processor comprising a high frequency (HF) digital equalizer including:
         i. a high frequency (HF) equalizer input adapted to receive $SD_{HF}[n]$, and
         ii. a high frequency (HF) equalizer output,
         wherein the HF equalizer is adapted to reduce frequency dependent distortions in the signal $SD_{HF}[n]$ caused by the level adjustment and digitizing processing in the high frequency analog to digital converter channel,
         whereby a frequency distortion-reduced form of high frequency digital signal $SD_{HF}[n]$ is presented at the HF equalizer output,
      b. an LF frequency distortion-reducing processor comprising a low frequency (LF) digital equalizer including:
         i. a low frequency (LF) equalizer input adapted to receive $SD_{LF}[n]$, and
         ii. a low frequency (LF) equalizer output,
         wherein the LF equalizer is adapted to reduce frequency dependent distortions in the signal $SD_{LF}$

[n] caused by the level adjustment and digitizing processing in the low frequency analog to digital converter channel, whereby a frequency distortion-reduced form of low frequency digital signal $SD_{LF}[n]$ is presented at the LF equalizer output, and E. a combiner processor including:
a combiner adapted to combine a distortion-reduced form of HF digital signal $SD_{HF}[n]$ received from the HF equalizer output with a distortion-reduced form of LF digital signal $SD_{LF}[n]$ received from the HF equalizer output, thereby providing an output signal SD[n] corresponding to the input analog signal SA(t).

6. A broadband digitizer according to claim 5, wherein the combiner processor further comprises:
a low frequency (LF) level distortion reducer including:
  a. a LF level distortion-reducing input adapted to receive the frequency distortion-reduced form of low frequency digital signal $SD_{LF}[n]$ presented at the LF equalizer output, and
  b. a LF level distortion-reduced output,
wherein the LF level distortion reducer is adapted to reduce level distortions in the signal $SD_{LF}[n]$ caused by processing in the low frequency analog to digital converter channel,
whereby a frequency and level distortion-reduced form of the low frequency digital signal $SD_{LF}[n]$ is presented at the LF level distortion-reduced output.

7. A broadband digitizer according to claim 6, wherein the combiner processor further comprises:
a low frequency (LF) time distortion reducer including:
  a. a low frequency (LF) time distortion reducer input adapted to receive the frequency and level distortion-reduced form of low frequency digital signal $SD_{LF}[n]$ presented at the LF level distortion-reduced output, and
  b. a LF time delay distortion reduced output,
wherein the LF time distortion reducer includes a controlled delay line adapted to reduce time delay distortions in the signal $SD_{LF}[n]$ caused by processing in the low frequency analog to digital converter channel, by adjusting the time position of the signal $SD_{LF}[n]$ received at the LF time distortion reducer input to match the time-position of the signal $SD_{HF}[n]$ at the HF equalizer output,
whereby a frequency, level and time delay distortion-reduced form of the low frequency digital signal $SD_{LF}[n]$ is presented at the LF time delay distortion reduced output.

8. A broadband digitizer according to claim 7, wherein the combiner processor further comprises:
an interpolator including:
  a. an interpolator input connected to the LF time delay distortion reducer output and adapted to receive a reduced distortion form of the digital signal $SD_{LF}[n]$ at a clock rate corresponding to the low frequency input signal sampling rate $SR_{LF}$ associated with the LF-ADC, and
  b. an interpolator output,
wherein the interpolator is adapted to raise the clock rate of the received reduced distortion form of $SD_{LF}[n]$ from $SR_{LF}$ associated with the LF-ADC, to the high frequency input signal sampling rate $SR_{HF}$, associated with the HF ADC, whereby the received reduced distortion form of $SD_{LF}[n]$ with an increased sampling rate $SR_{HF}$ is presented at the interpolator output.

9. A broadband digitizer according to claim 8, wherein the combiner processor further comprises:
a DC adder including:
  a. a first DC adder input coupled to the interpolator output, and adapted to receive the synchronized received distortion-reduced form of $SD_{LF}[n]$ at the interpolator output,
  b. a second DC adder input adapted to receive an applied DC signal, and
  c. a DC adder output,
wherein the DC adder sums the signal at the first DC adder input with the signal at the second DC adder input, and presents the sum corresponding to a DC-augmented form of $SD_{HF}[n]$ at the DC adder output.

10. A broadband digitizer according to claim 9, wherein the combiner processor further comprises:
an output adder including:
  a. a first output adder input connected to the DC adder output and adapted to receive the DC-augmented form of $SD_{HF}[n]$,
  b. a second output adder input connected to the HF equalized output and adapted to receive the frequency distortion-reduced form of high frequency digital signal $SD_{HF}[n]$, and
  c. an adder output adapted to form a sum of the DC-augmented form of $SD_{HF}[n]$ and the distortion-reduced form of LF digital signal $SD_{LF}[n]$, thereby providing an output signal SD[n] corresponding to the input analog signal SA(t).

11. A broadband digitizer comprising:
A. a splitter adapted to receive an applied input analog signal SA(t) at a splitter input and split the received input analog signal SA(t) into a high frequency (HF) analog signal $SA_{HF}(t)$ in a relatively high frequency (HF) spectral range, and a low frequency (LF) analog signal $SA_{LF}(t)$ in a relatively low frequency (LF) spectral range,
B. a high frequency (HF) analog to digital converter (ADC) channel, including a high frequency (HF) processor operative over the HF spectral range to:
  a. receive the HF analog signal $SA_{HF}(t)$ from the splitter at an HF ADC channel input and adjust the level of the received HF analog signal $SA_{HF}(t)$, and
  b. in a high frequency analog to digital converter (HF-ADC) characterized by a relatively high frequency sampling rate $SR_{HF}$, digitize the amplitude-adjusted HF analog signal $SA_{HF}(t)$ to a high frequency (HF) digital signal $SD_{HF}[n]$,
C. a low frequency (LF) analog to digital converter (ADC) channel, including a low frequency (LF) processor operative over the LF spectral range, to:
  a. receive the LF analog signal $SA_{LF}(t)$ from the splitter at an LF ADC channel input and adjust the level of the received LF analog signal $SA_{LF}(t)$, and
  b. in a low frequency analog to digital converter (LF-ADC) characterized by a relatively low frequency sampling rate $SR_{LF}$, digitize the amplitude-adjusted LF analog signal $SA_{LF}(t)$ to a low frequency (LF) digital signal $SD_{LF}[n]$,
D. a frequency distortion processor including:
  a. an HF frequency distortion-reducing processor comprising a high frequency (HF) digital equalizer including:

i. a high frequency (HF) equalizer input adapted to receive $SD_{HF}[n]$, and
ii. a high frequency (HF) equalizer output,
wherein the HF equalizer is adapted to reduce frequency dependent distortions in the signal $SD_{HF}[n]$ caused by the level adjustment and digitizing processing in the high frequency analog to digital converter channel,
whereby a frequency distortion-reduced form of high frequency digital signal $SD_{HF}[n]$ is presented at the HF equalizer output,
b. an LF frequency distortion-reducing processor comprising a low frequency (LF) digital equalizer including:
i. a low frequency (LF) equalizer input adapted to receive $SD_{LF}[n]$, and
ii. a low frequency (LF) equalizer output,
wherein the LF equalizer is adapted to reduce frequency dependent distortions in the signal $SD_{LF}[n]$ caused by the level adjustment and digitizing processing in the low frequency analog to digital converter channel,
whereby a frequency distortion-reduced form of low frequency digital signal $SD_{LF}[n]$ is presented at the LF equalizer output, and
E. a combiner processor including:
a combiner adapted to combine a distortion-reduced form of HF digital signal $SD_{HF}[n]$ received from the HF equalizer output with a distortion-reduced form of LF digital signal $SD_{LF}[n]$ received from the HF equalizer output, thereby providing an output signal SD[n] corresponding to the input analog signal SA(t),
wherein the splitter comprises:
a capacitor having a first capacitor terminal and a second capacitor terminal, wherein:
AA. the first capacitor terminal is connected to the splitter input, and the second capacitor terminal is connected to the HF ADC channel input,
wherein a portion of the input signal SA(t) at the second capacitor terminal corresponds to $SA_{HF}(t)$ referenced to ground, and is in the high frequency spectral range, and
BB. a signal across the first capacitor terminal and the second capacitor terminal corresponds to $SA(t)-SA_{HF}(t)$, and is coupled to the LF ADC channel input, wherein $SA(t)-SA_{HF}(t)$ is in the low frequency spectral range.

12. A broadband digitizer, comprising:
A. a splitter adapted to receive an applied input analog signal SA(t) at a splitter input and split the received input analog signal SA(t) into a high frequency (HF) analog signal $SA_{HF}(t)$ in a relatively high frequency (HF) spectral range, and a low frequency (LF) analog signal $SA_{LF}(t)$ in a relatively low frequency (LF) spectral range,
B. a high frequency (HF) analog to digital converter (ADC) channel, including a high frequency (HF) processor operative over the HF spectral range to:
a. receive the HF analog signal $SA_{HF}(t)$ from the splitter at an HF ADC channel input and adjust the level of the received HF analog signal $SA_{HF}(t)$, and
b. in a high frequency analog to digital converter (HF-ADC) characterized by a relatively high frequency sampling rate $SR_{HF}$, digitize the amplitude-adjusted HF analog signal $SA_{HF}(t)$ to a high frequency (HF) digital signal $SD_{HF}[n]$, C. a low frequency (LF) analog to digital converter (ADC) channel, including a low frequency (LF) processor operative over the LF spectral range to:
a. receive the LF analog signal $SA_{LF}(t)$ from the splitter at an LF ADC channel input, and adjust the level of the received LF analog signal $SA_{LF}(t)$, and
b. in a low frequency analog to digital converter (LF-ADC) characterized by a relatively low frequency sampling rate $SR_{LF}$, digitize the amplitude-adjusted LF analog signal $SA_{LF}(t)$ to a low frequency (LF) digital signal $SD_{LF}[n]$, and
D. a frequency distortion processor including:
a. a HF frequency distortion-reducing processor comprising a high frequency (HF) digital equalizer including:
i. a high frequency (HF) equalizer input adapted to receive $SD_{HF}[n]$, and
ii. a high frequency (HF) equalizer output,
wherein the HF equalizer is adapted to reduce frequency dependent distortions in the signal $SD_{HF}[n]$ caused by the level adjustment and digitizing processing in the high frequency analog to digital converter channel,
whereby a frequency distortion-reduced form of high frequency digital signal $SD_{HF}[n]$ is presented at the HF equalizer output, and
b. an LF frequency distortion-reducing processor comprising a low frequency (LF) digital equalizer including:
i. a low frequency (LF) equalizer input adapted to receive $SD_{LF}[n]$, and
ii. a low frequency (LF) equalizer output,
wherein the LF equalizer is adapted to reduce frequency dependent distortions in the signal $SD_{LF}[n]$ caused by the level adjustment and digitizing in the low frequency analog to digital converter channel,
whereby a frequency distortion-reduced form of low frequency digital signal $SD_{LF}[n]$ is presented at the LF equalizer output,
E. a combiner processor including:
a combiner adapted to combine a distortion-reduced form of HF digital signal $SD_{HF}[n]$ received from the HF equalizer output with a distortion-reduced form of LF digital signal $SD_{LF}[n]$ received from the HF equalizer output, thereby providing an output signal SD[n] corresponding to the input analog signal SA(t), and
wherein:
AA. the high frequency analog to digital converter channel includes a high frequency (HF) front end connected in cascade with the HF ADC,
a. wherein the HF front end is coupled between the second terminal of the capacitor and an input of the high frequency ADC, and
b. wherein the high frequency front end includes a cascade-coupled amplifier and a high frequency digitally controlled attenuator enabling level adjustment of the input signal $SA_{HF}(t)$, and is adapted to receive ground-referenced $SA_{HF}(t)$ and perform level adjustment of the signal $SA_{HF}(t)$, and apply the level-adjusted $SA_{HF}(t)$ to the input of the HF ADC, which is adapted to digitize the level-adjusted $SA_{HF}(t)$ to corresponding $SD_{HF}[n]$, and
BB. the low frequency analog to digital converter channel includes a low frequency (LF) front end connected in cascade with the LF ADC, a. wherein the LF front end is coupled between both the first and second terminals of the capacitor and an input of the LF ADC, and wherein the low frequency front end includes:
   a differential amplifier having an inverting input terminal and a non-inverting input terminal adapted to receive ground-referenced SA(t) and ground-referenced $SA_{HF}(t)$ from respective ones of the first and second terminals of the capacitor, and a differential amplifier output terminal presenting $SA(t)-SA_{HF}(t)$, corresponding to $SA_{LF}(t)$, and
b. an amplifier and a digitally controlled attenuator cascade-coupled from the differential amplifier output terminal,
whereby the differential amplifier and attenuator are adapted to perform level adjustment of the input signal $SA_{LF}(t)$, and apply the level-adjusted $SA_{LF}(t)$ to the input of the LF ADC, which is adapted to digitize the level-adjusted $SA_{LF}(t)$ to a corresponding $SD_{LF}[n]$.

* * * * *